(12) United States Patent
Iwasaki et al.

(10) Patent No.: US 8,994,183 B2
(45) Date of Patent: Mar. 31, 2015

(54) MULTILAYER INTERCONNECTS WITH AN EXTENSION PART

(71) Applicant: Panasonic Corporation, Osaka (JP)

(72) Inventors: Akihisa Iwasaki, Shiga (JP); Michiya Takahashi, Kyoto (JP); Akira Ueki, Toyama (JP); Chikako Chida, Toyama (JP); Dai Motojima, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 136 days.

(21) Appl. No.: 13/756,164

(22) Filed: Jan. 31, 2013

(65) Prior Publication Data

US 2013/0140711 A1 Jun. 6, 2013

Related U.S. Application Data

(63) Continuation of application No. PCT/JP2011/002969, filed on May 27, 2011.

(30) Foreign Application Priority Data

Oct. 19, 2010 (JP) .................................. 2010-234868

(51) Int. Cl.
*H01L 23/48* (2006.01)
*H01L 21/4763* (2006.01)
(Continued)

(52) U.S. Cl.
CPC .......... *H01L 23/481* (2013.01); *H01L 23/5226* (2013.01); *H01L 23/528* (2013.01); *H01L 2924/0002* (2013.01)
USPC ............................ 257/774; 438/620; 438/622

(58) Field of Classification Search
CPC . H01L 23/5226; H01L 23/481; H01L 23/528; H01L 23/5384; H01L 23/49838; H01L 21/486; H01L 23/49822; H01L 2924/0002; H05K 2201/096; H05K 2201/09609
See application file for complete search history.

(56) References Cited

U.S. PATENT DOCUMENTS 5,625,232 A 4/1997 Numata et al.
6,207,553 B1 * 3/2001 Buynoski et al. ............. 438/622
(Continued)

FOREIGN PATENT DOCUMENTS

JP 06-077225 A 3/1994
JP 09-213696 A 8/1997
(Continued)

OTHER PUBLICATIONS

International Search Report mailed Jul. 5, 2011 issued in corresponding International Application No. PCT/JP2011/002969.

*Primary Examiner* — Alonzo Chambliss
(74) *Attorney, Agent, or Firm* — McDermott Will & Emery LLP

(57) ABSTRACT

A semiconductor device includes a stacked via structure including a plurality of first vias formed over a substrate, a first interconnect formed on the plurality of first vias, a plurality of second vias formed on the first interconnect, and a second interconnect formed on the plurality of second vias. One of the first vias closest to one end part of the first interconnect and one of the second vias closest to the one end part of the first interconnect at least partially overlap with each other as viewed in the plane, and the first interconnect has a first extension part extending from a position of an end of the first via toward the one end part of the first interconnect and having a length which is more than six times as long as a via width of the first via.

22 Claims, 11 Drawing Sheets

(51) Int. Cl.
*H01L 23/522* (2006.01)
*H01L 23/528* (2006.01)

(56) References Cited

U.S. PATENT DOCUMENTS

| | | | |
|---|---|---|---|
| 6,650,010 B2 * | 11/2003 | Davis et al. | 257/700 |
| 2002/0058411 A1 | 5/2002 | Hasegawa et al. | |
| 2005/0160391 A1 | 7/2005 | Orita | |
| 2006/0103017 A1 | 5/2006 | Usui et al. | |
| 2008/0142977 A1 | 6/2008 | Watanabe et al. | |
| 2010/0237508 A1 * | 9/2010 | Utsumi | 257/774 |

FOREIGN PATENT DOCUMENTS

| | | |
|---|---|---|
| JP | 10-214893 A | 8/1998 |
| JP | 11-017072 A | 1/1999 |
| JP | 2005-209776 A | 8/2005 |
| JP | 2007-235157 A | 9/2007 |
| JP | 2007-294586 A | 11/2007 |
| JP | 2008-227130 A | 9/2008 |
| JP | 2010-232239 A | 10/2010 |

* cited by examiner $R_{11}=R_{12}=R_{13}(=R_W)$
$R_{21}=R_{22}(=R_V)$

PRIOR ART

US 8,994,183 B2

MULTILAYER INTERCONNECTS WITH AN EXTENSION PART

CROSS-REFERENCE TO RELATED APPLICATION

This is a continuation of International Application No. PCT/JP2011/002969 filed on May 27, 2011, which claims priority to Japanese Patent Application No. 2010-234868 filed on Oct. 19, 2010. The entire disclosures of these applications are incorporated by reference herein.

BACKGROUND

The technique disclosed herein relates to a semiconductor device, and particularly relates to a stacked via structure used for multiple layers of interconnects.

In recent years, advances in miniaturization of semiconductor devices in a semiconductor manufacturing process have been accompanied by demands for higher integration and higher speed of semiconductor integrated circuit devices. In association with the miniaturization, miniaturization of an interconnect width, an interconnect thickness, and a via diameter has been achieved, resulting in an increase in density of current flowing through a metal interconnect.

In a metal interconnect, a phenomenon called "electromigration (hereinafter referred to as "EM")" occurs due to collision among electrons and metal atoms upon current application. If current is applied for a long period of time, an interconnect(s) or a via(s) may be disconnected, and therefore defects influencing reliability may occur. For such a reason, there is a design limitation which is the allowable density of current flowing through a metal interconnect. However, since the current density is increased with the miniaturization, a difficulty in suppressing the current density within the allowable range has been increased.

In a semiconductor integrated circuit device such as a large scale integration (LSI) semiconductor device, there is a disadvantage that EM resistance is reduced due to current concentration in a via part connecting metal interconnects of different layers. For example, a method for overcoming the disadvantage by a layout in which a via length is increased to relieve the current concentration in the via part has been proposed (see Japanese Patent Publication No. H10-214893).

SUMMARY

In a semiconductor integrated circuit device, e.g., a power interconnect through which high current flows is provided. For example, it is often the case that the power interconnect supplies current from the uppermost interconnect to the lowermost interconnect by way of a plurality of intermediate interconnects and vias. Such a structure is called a "stacked via structure." High current flows through stacked vias. Thus, in the stacked via structure, a plurality of vias are arranged in parallel for each interconnect, and two or more via layers are provided. Since the plurality of vias arranged in parallel are provided in such a structure, the current concentration is more likely to occur in a particular via(s) arranged in a lower via layer(s) as compared to a via(s) arranged in the via layer(s) above the lower via layer(s).

The increase in via length as described in Japanese Patent Publication No. H10-214893 is effective for relieving the current concentration. However, in the case where the current density is high (i.e., a current amount is large) in the stacked via structure, Joule heat is generated in the via part, and a temperature rises in a particular part. In addition, since the current concentration occurs in the particular via(s) arranged in the lower via layer(s) in the stacked via structure including the plural rows of vias, the temperature further rises during an operation. The rise in temperature accelerates the collision among electrons and metal atoms, and therefore the EM occurs notably. Thus, for the foregoing stacked via structure, another disadvantage that the EM resistance is reduced due to Joule heat generation may arise.

According to a semiconductor device of the present disclosure, a stacked via structure having EM resistance with reduced Joule heat generation can be provided.

A semiconductor device of one example of the present disclosure includes a stacked via structure including a plurality of first vias formed over a substrate, a first interconnect formed on the plurality of first vias, a plurality of second vias formed on the first interconnect, and a second interconnect formed on the plurality of second vias. One of the plurality of first vias closest to one end part of the first interconnect and one of the plurality of second vias closest to the one end part of the first interconnect at least partially overlap with each other as viewed in plane, and the first interconnect has a first extension part extending from a position of an end of the one of the plurality of first vias closest to the one end part of the first interconnect toward the one end part of the first interconnect and having a length which is more than six times as long as a via width of the one of the plurality of first vias.

According to the foregoing configuration, since the first extension part extends from the first via closest to the one end part of the first interconnect toward the one end part of the first interconnect, Joule heat generated in the first via in which current concentration is likely to occur can be effectively dissipated. Thus, an increase in temperature of the first via can be reduced, thereby significantly increasing EM resistance. As a result, an allowable current amount can be increased without increasing the via width of the first via. In particular, since the length of the first extension part is more than six times as long as the via width of the first via, a heat dissipating effect is increased as compared to a conventional stacked via structure.

A semiconductor device of another example of the present disclosure includes a stacked via structure including a plurality of first vias formed over a substrate, a first interconnect formed on the plurality of first vias, a second via formed on the first interconnect, and a second interconnect formed on the second via. The first interconnect has an extension part extending from a position of an end of one of the plurality of first vias closest to one end part of the first interconnect toward the one end part of the first interconnect and having a length which is more than six times as long as a via width of the one of the plurality of first vias.

As described above, a plurality of second vias are not necessarily provided above the first vias. In such a case, there is a possibility that current is concentrated in the first via, and Joule heat generated in the first via can be effectively dissipated through the first extension part.

According to the semiconductor device of the another example of the present disclosure, Joule heat generated in the first via can be effectively dissipated through the first extension of the first interconnect. Thus, an increase in temperature of the first via can be reduced, thereby significantly increasing the EM resistance.

DETAILED DESCRIPTION

Joule Heat Generation in Stacked Via Structure

Before embodiments are described, disadvantages relating to current concentration and Joule heat generation in a stacked via structure will be described with reference to drawings. In the present specification, the "stacked via" means a stack of a plurality of vias, and such a stack electrically connects an upper interconnect and a lower interconnect in the case where a plurality of interconnect layers are formed. As long as a via in an upper via layer and a via in a lower via layer at least partially overlap with each other as viewed from above a substrate, such a structure has the "stacked via." In addition, the "stacked via structure" indicates an interconnect structure with a stacked via formed by a plurality of vias in a predetermined region.

Figure 1A:
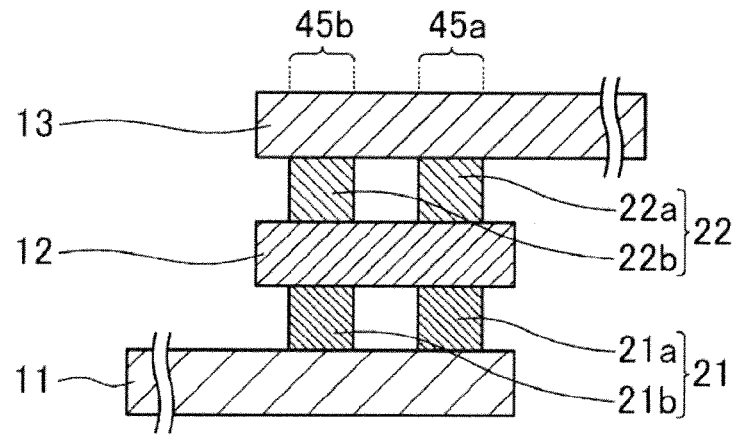
FIG. 1A is a cross-sectional view schematically illustrating a stacked via structure in a semiconductor device of a first reference example.
Figure 1B:
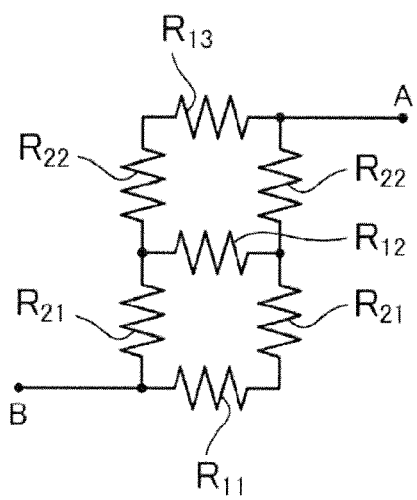
FIGS. 1B and 1C are diagrams for describing current concentration and Joule heat generation in the stacked via structure illustrated in FIG. 1A.
Figure 1C:
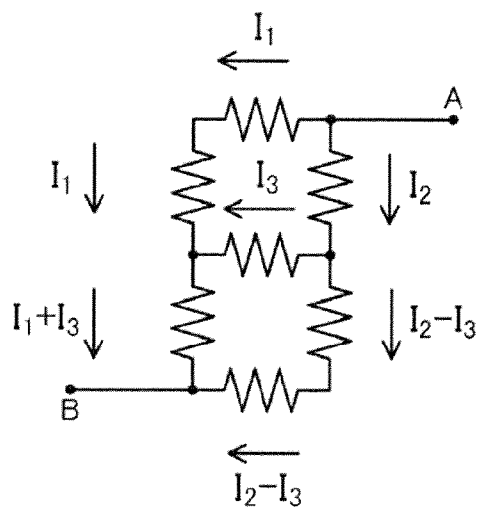

FIG. 1A is a cross-sectional view schematically illustrating the stacked via structure in a semiconductor device of a first reference example. FIGS. 1B and 1C are diagrams for describing the current concentration and the Joule heat generation in the stacked via structure illustrated in FIG. 1A.

In the this example, an interconnect 11 formed in a first interconnect layer, an interconnect 12 formed in a second interconnect layer, and an interconnect 13 formed in a third interconnect layer are stacked in this order from the bottom on a substrate (not shown in the figure) made of a semiconductor. A stacked via structure will be described, which includes a plurality of vias 21 connecting the interconnects 11, 12 in parallel and a plurality of vias 22 connecting the interconnects 12, 13 in parallel.

In the example illustrated in FIGS. 1A-1C, a stacked via 45a is formed by a via 21a and a via 22a, and a stacked via 45b is formed by a via 21b and a via 22b. Reference characters "$R_{11}$," "$R_{12}$," and "$R_{13}$" in FIGS. 1B and 1C represent resistances of the interconnects 11, 12, 13, respectively. Reference characters "$R_{21}$" and "$R_{22}$" represent resistances of the vias 21, 22, respectively.

In the foregoing stacked via structure, there are the interconnect resistances $R_{11}$, $R_{12}$, $R_{13}$ and the via resistances $R_{21}$ and $R_{22}$ as illustrated in FIG. 1B. If the thicknesses and materials of the interconnects 11, 12, 13 are identical to each other, and the materials and shapes of the vias 21, 22 are identical to each other, it can be assumed that resistances of the interconnects 11, 12, 13 are, as will be described later, identical to each other and resistances of the vias 21, 22 are identical to each other. In such a case, current flows through the interconnect 13 (having the resistance $R_{13}$), the via 22b (having the resistance $R_{22}$), the via 21a (having the resistance $R_{21}$), and the interconnect 11 (having the resistance $R_{11}$) at the same current level. Current flows through the via 22b (having the resistance $R_{22}$) and the via 21b (having the resistance $R_{21}$) at the same current level. A reference character "Rw" represents resistance of each interconnect, and a reference character "Rv" represents resistance of each of the vias 21, 22. A relationship between $I_1$ and $I_2$ is represented by the following equation:

$$I_2 = I_1 \cdot \{\tfrac{3}{2}Rv + Rw - Rv^2/2(Rw+Rv)\}/(\tfrac{1}{2}Rv + Rw)$$

where "$I_1$" represents current flowing through the interconnect 13 or the via 22b, and "$I_2$" represents current flowing through the via 22a.

The current concentration and the Joule heat generation in the via part will be described. If, e.g., values for Rw and Rv are equal to each other, it is, based on the foregoing equation, estimated that current flowing through the via 21b is half again as high as current flowing through the via 21a. Similarly, it is estimated that current flowing through the via 22a is half again as high as current flowing through the via 22b. Since a Joule heat amount Q is proportional to the product of resistance R and the square of current I ($Q \propto RI^2$), Joule heat 2.25 times as much as that in the via 21a is generated in the via 21b, and Joule heat 2.25 times as much as that in the via 22b is generated in the via 22a.

The similar calculation shows that higher current flows, in the case where the resistance of the interconnect and the resistance of the via are different from each other, through the via 21b than through the via 21a, and higher current flows through the via 22a than through the via 22b.

An increase in length or dimensions of a particular via(s) as in Japanese Patent Publication No. H10-214893 brings an effect to relieve the current concentration and therefore reduce the Joule heat generation. However, there is concern about an increase in chip area due to the increase in length or dimensions of the via(s) connected to a micro-interconnect(s) positioned in a lower interconnect layer(s), and there is also concern about processing, such as instability of a via shape. Thus, the technique as in Japanese Patent Publication No. H10-214893 cannot be employed.

Figure 2:
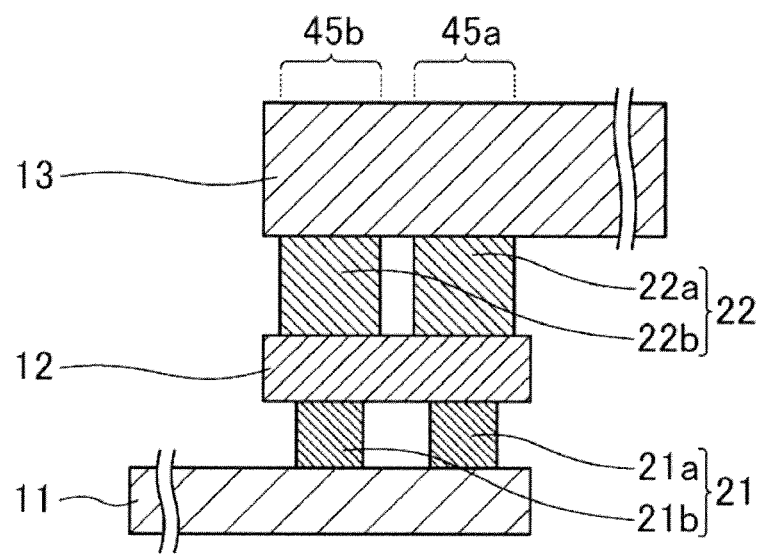
FIG. 2 is a cross-sectional view schematically illustrating a stacked via structure of a semiconductor device of a second reference example in the case where the cross-sectional areas of an interconnect positioned in the uppermost interconnect layer and a plurality of vias positioned in an upper via layer are increased.

Next, FIG. 2 is a cross-sectional view schematically illustrating a stacked via structure of a semiconductor device of a second reference example in the case where the cross-sectional areas of an interconnect 13 positioned in the uppermost interconnect layer and a plurality of vias are increased.

Referring to FIG. 2, suppose that current flows from a rough interconnect layer to a micro-interconnect layer in the stacked via structure. In the stacked via structure, the cross-sectional area of the interconnect 13 in a current flow direction thereof in a third interconnect layer is larger than that of an interconnect 11 in a first interconnect layer and that of an interconnect 12 in a second interconnect layer, and the cross-sectional area of the via 22 is larger than that of a via 21. In such a case, the calculation similar to the foregoing shows that the stacked via structure connecting between the rough interconnect layer and the micro-interconnect layer is configured as follows. Current concentration in the via 22a (via on an upper interconnect side) is relieved, but current is more likely to be concentrated in the via 21b (via on a lower interconnect side) than in the via 21a. In addition, current values obtained by the calculation show that the current concentration is more likely to occur in the case illustrated in FIG. 2 than in the case illustrated in FIGS. 1A-1C.

As described above, in the stacked via structure, the current concentration is most likely to occur in the via connected to the lowermost interconnect and positioned on a downstream side in the current flow direction. Since Joule heat generation is influenced by the square of a current amount, Joule heat generation is increased in the via on the downstream side in the current flow direction.

Various studies on an interconnect structure for effectively dissipating heat generated in a via in which current concentration is likely to occur have been conducted by the present inventors, and the present inventors arrived at the configuration in which an interconnect(s) forming a stacked via structure is extended toward outside the stacked via structure to dissipate heat. The embodiments of the present disclosure will be described below. Note that the same reference numerals as those shown in one of the embodiments will be used to represent equivalent elements in the other embodiments, and the description thereof will not be repeated.

First Embodiment

A semiconductor device of a first embodiment of the present disclosure will be described with reference to drawings.

Figure 3A:
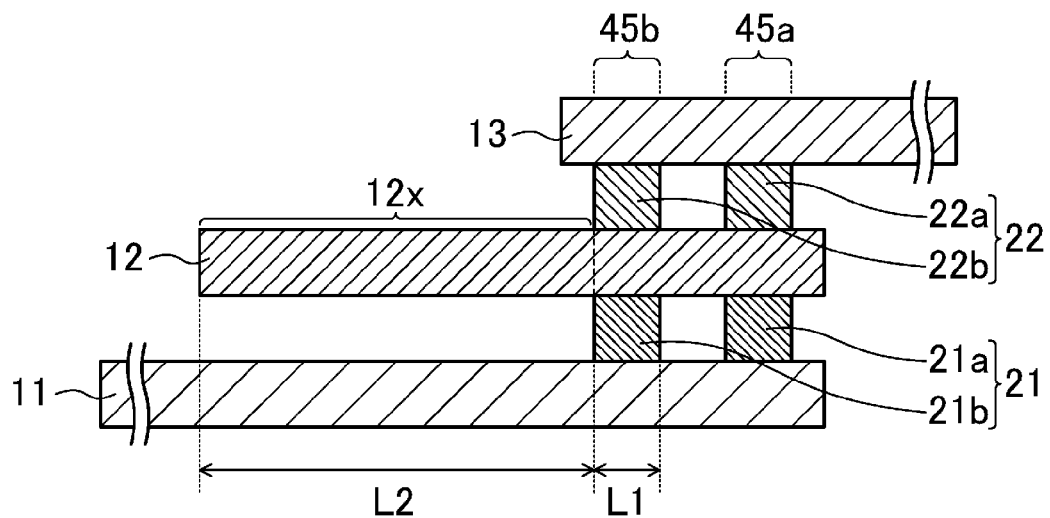
FIG. 3A is a cross-sectional view illustrating a semiconductor device of a first embodiment.

FIG. 3A is a cross-sectional view illustrating the semiconductor device of the first embodiment. Since FIG. 3A is the schematic view, a length L2 is illustrated shorter than an actual length. However, the length L2 is, as will be described later, preferably more than six times as long as a via width L1. Note that FIG. 3A illustrates a longitudinal cross section passing the centers of a plurality of vias 21, 22.

Referring to FIG. 3A, the semiconductor device of the present embodiment includes the following: a plurality of interlayer insulating films formed on a substrate (not shown in the figure) made of a semiconductor; an interconnect 11 formed in a first interconnect layer; an interconnect 12 formed in a second interconnect layer above the interconnect 11; an interconnect 13 formed in a third interconnect layer above the interconnect 12; the plurality of vias 21 connecting between the interconnects 11, 12; and the plurality of vias 22 connecting between the interconnects 12, 13. The interlayer insulating film is interposed between the interconnects 11, 12 and between the interconnects 12, 13. The vias 21 are a via 21a and a via 21b formed in parallel to each other between the interconnects 11, 12, and the vias 22 are a via 22a and a via 22b formed in parallel to each other between the interconnects 12, 13.

The vias 21a, 22a at least partially overlap with each other as viewed in the plane, and form a stacked via 45a. The vias 21b, 22b at least partially overlap with each other as viewed in the plane, and form a stacked via 45b. That is, the interconnects 13, 11 are electrically connected together through a stacked via structure including the vias 21, 22.

The materials of the interconnects 11, 12, 13 may be a conductive material such as copper (Cu), a copper alloy, aluminum (Al), tungsten, polysilicon, silicide, titanium (Ti), or tantalum (Ta). A via material may be silicon (polysilicon), silicide, a metal compound containing Ti or Ta, or metal such as Cu or tungsten (W).

The vias 21a, 21b are arranged with a relatively-narrow pitch, and the vias 22a, 22b are arranged with a relatively-narrow pitch. In the stacked via structure, resistance in a current flow path is lower than that in multiple layers of, e.g., signal interconnects, and a voltage drop (IR drop) is suppressed at the minimum level. Thus, the stacked via structure is preferably used for a section configured to supply high current, such as a power supply.

In the case of the semiconductor device illustrated in FIG. 3A, current flows from the interconnect 13 in the uppermost interconnect layer to the interconnect 11 in the lowermost interconnect layer during an operation.

The semiconductor device of the present embodiment is different from that illustrated in FIGS. 1A-1C as follows. In the semiconductor device of the present embodiment, the interconnect 12 has an extension part 12x extending from a formation position of the via 21b closest to one end part (interconnect end) of the interconnect 12 (i.e., a formation position of the via 21b on a downstream side of the interconnects 11, 12 in a current flow direction thereof) toward the one end part of the interconnect 12 by the length L2 which is more than six times as long as the via width L1 of the via 21b. It can be said that the via 21b is one of the vias 21 positioned in a downstream end part of a current flow path for current flowing in the interconnect 12 in an extension direction thereof. Note that the position of an end of the stacked via 45b is substantially coincident with the position of an end of the via 21b in the semiconductor device of the present disclosure.

The via width of the via 21b means the length of part of the via 21b contacting the interconnect 12 in the extension direction of the interconnect 12 in a region where the vias 21 are formed. That is, the via width of the via connected to the interconnect formed with the extension part means the length of part of the via contacting such an interconnect in an extension direction of the extension part.

In this configuration, since the via does not directly contact the extension part 12x, a current flow path is not substantially formed in the extension part 12x during the operation. The phrase "current flow path is not substantially formed" also implies the case where the position of an end of the via 22b is somewhat displaced relative to the position of the end of the via 21b in the extension direction of the extension part 12x.

According to the foregoing configuration, since almost no Joule heat is generated in the extension part 12x, the extension part 12x can function as a heat dissipator. That is, the extension part 12x is formed in the interconnect 12 having high heat conductivity, thereby obtaining, for the interconnect 12, an additional surface area (perimeter) equivalent to the length L2. Heat is dissipated at a contact part between the interconnect and the interlayer insulating film interposed between adjacent ones of the interconnects. Thus, Joule heat generated in the via 21b in which current is concentrated can be effectively dissipated through the extension part 12x, thereby significantly improving EM resistance. Consequently, even if the via width of the via 21b connected to the lowermost interconnect cannot be increased, high current can be applied.

In the semiconductor device of the present embodiment, the width of the interconnect 12 and the width of the interconnect 13 may be different from each other or substantially identical to each other. The phrase "substantially identical" means that variation in width due to, e.g., variation in processing is taken into consideration. In addition, the width of the interconnect means the width of the interconnect in a direction perpendicular to an extension part length direction as viewed from above the substrate. One or more upper interconnects may be further formed above the interconnect 13. In such a case, the widths of the interconnects 12, 13 which are intermediate interconnects are identical to each other, and are less than the width of the uppermost interconnect used as, e.g., a power interconnect. In such a manner, the extension part 12x can be effectively arranged in a free space. Particularly in the case where the widths of the interconnects 12, 13 are the identical minimum widths, a circuit area can be reduced to the minimum area with improvement of the EM resistance. Thus, the circuit area can be reduced as compared to the case where the width of any of the intermediate interconnects (interconnects 12, 13) is increased. Note that the "intermediate interconnects" means one or more of a plurality of interconnects formed in an interconnect layer(s) other than the lowermost interconnect layer and the uppermost interconnect layer.

Although the extension part 12x extends straight in FIG. 3A, the extension part 12x may be in a shape having a curved part, such as a spiral shape, or a shape having a bent part. In such a case, the length L2 of the extension part 12x in the extension direction thereof may be more than six times as long as the via width L1.

The interconnects such as the interconnects 11, 12 are not limited to an interconnect having a uniform width. For example, the interconnect width may be different between the extension part 12x of the interconnect 12 and other part of the interconnect 12, or the width of the interconnect 11, 12 is greater than the length of the interconnect 11, 12 in the region where the vias 21, 22 are provided. However, since the similar advantage can be realized with a small circuit area in the case where the interconnect has the uniform width, the interconnect preferably has the uniform width.

Figure 3B:
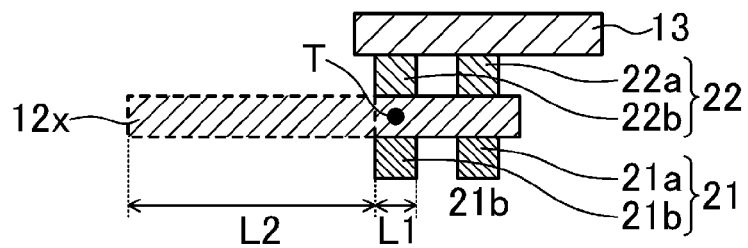
FIG. 3B is a cross-sectional view illustrating a model of the semiconductor device.
Figure 3C:
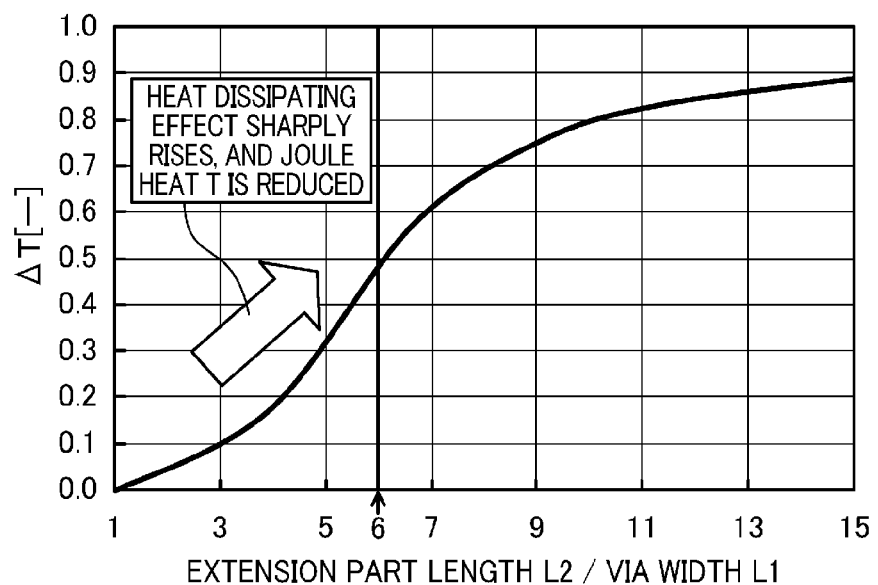
FIG. 3C is a graph illustrating simulation results of a relationship between a length ratio of an extension part of an interconnect and a heat dissipating effect value ΔT in the semiconductor device having a stacked via structure.

Next, a relationship between the length L2 of the extension part 12x and the via width L1 of the via 21b will be described. FIG. 3C is a graph illustrating simulation results of a relationship between a length ratio of the extension part of the interconnect and a heat dissipating effect value ΔT in the semiconductor device having the stacked via structure. In a semiconductor device including, referring to FIG. 3B, a plurality of vias 21, an interconnect 12 having an extension part 12x, a plurality of vias 22, and an interconnect 13, the temperature of the interconnect 12 in a position right above the via 21b was calculated for different lengths L2 of the extension part 12x. The value ΔT represented by the vertical axis in FIG. 3C indicates the rate of temperature change in the case where a temperature change due to heat dissipation in the state in which the extension part 12x is extended to the maximum possible extent in a realistic layout is represented by "1."

The horizontal axis indicates (the length L2 of the extension part 12x)/(the via width L1 of the via 21b in which current is concentrated).

In the stacked via structure of the present embodiment, current does not flow through the extension part 12x, and therefore Joule heat is not generated. Thus, the extension part 12x functions as a heat dissipator configured to effectively dissipate Joule heat generated in the via 21b in which the current concentration is likely to occur.

The results illustrated in FIG. 3C show that the heat dissipating effect value ΔT of the extension part 12x functioning as the heat dissipator sharply rises within a L2/L1 (the length ratio of the extension part length to the via width) value of 1-6 and slowly rises for a L2/L1 value of 6 or more. Thus, in order to obtain a sufficient heat dissipating effect, the length ratio of the extension part length to the via width is preferably set at a value of at least 6 or more. This realizes the configuration in which heat generated in the via can be effectively dissipated.

However, the sufficient length of the extension part 12x may not be ensured in, e.g., an actual layout. In such a case, a certain level of the heat dissipating effect can be ensured when the ratio of the extension part length to the via width is about 5. Thus, even if high current is applied, EM occurrence can be somewhat reduced as compared to the case where the extension part 12x is not provided. Note that a certain level of the heat dissipating effect of the extension part 12x can be ensured if the length L2 of the extension part 12x is at least greater than the via width L1.

If there is a sufficient region in a layout, the L2/L1 ratio is preferably 8 or more so that the heat dissipating effect can be further expected. More preferably, the L2/L1 ratio is 10 or more because the rate of rise in the heat dissipating effect is small for a L2/L1 ratio of 10 or more.

FIG. 3C illustrates the simulation results for a fixed via width L1 and the different lengths L2 of the extension part 12x. Even if the via width L1 varies within a practical range, the similar results can be obtained.

Next, the semiconductor device of the present embodiment having the stacked via structure will be described in comparison with a semiconductor device of a reference example.

Figure 4:
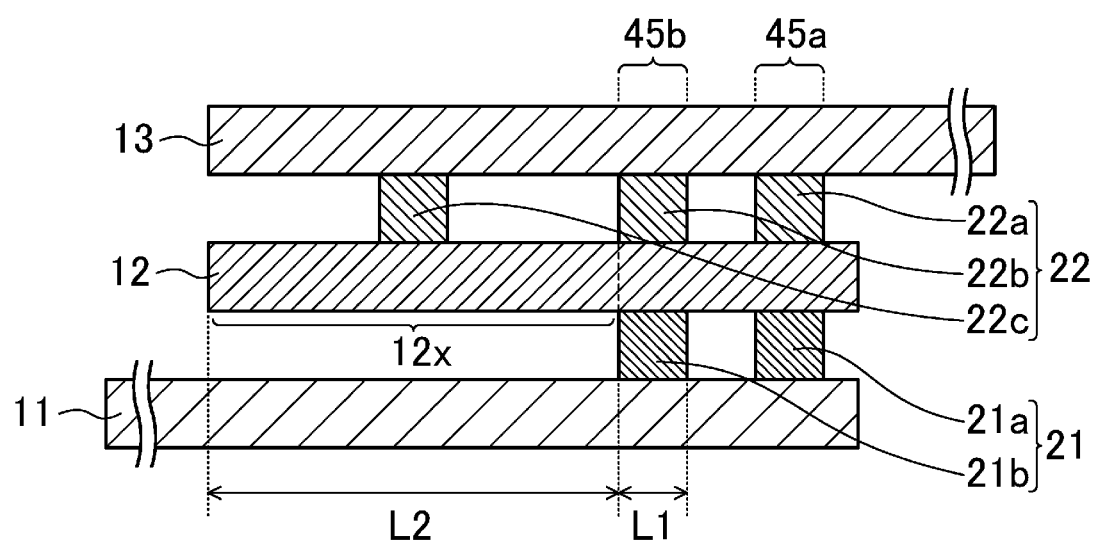
FIG. 4 is a cross-sectional view illustrating a semiconductor device of a third reference example.

FIG. 4 is a cross-sectional view illustrating a semiconductor device of a third reference example.

In the semiconductor device of the present reference example illustrated in FIG. 4, a via 22c connecting an extension part 12x of an interconnect 12 and an interconnect 13 together is further provided, and the other configuration is similar to that of the semiconductor device of the foregoing embodiment. The via 22c does not form a stacked via together with any of a plurality of vias 21. Note that the resistance of the via 22c is equal to those of vias 22a, 22b.

In the semiconductor device of the present reference example, when current flows from the uppermost interconnect to the lowermost interconnect, the current also flows through the via 22c.

Thus, since more current flows through the via 21b of the present reference example than through the via 21b of the foregoing embodiment, EM resistance is reduced due to Joule heat generation. In addition, since current flows through the extension part 12x of the interconnect 12, the extension part 12x does not sufficiently function as a heat dissipator. As described above, in order to allow the extension part 12x to sufficiently function as the heat dissipator, it is required that the via 22c which will form a current flow path during an operation is not connected to the extension part 12x.

Semiconductor Device of First Variation

Figure 5A:
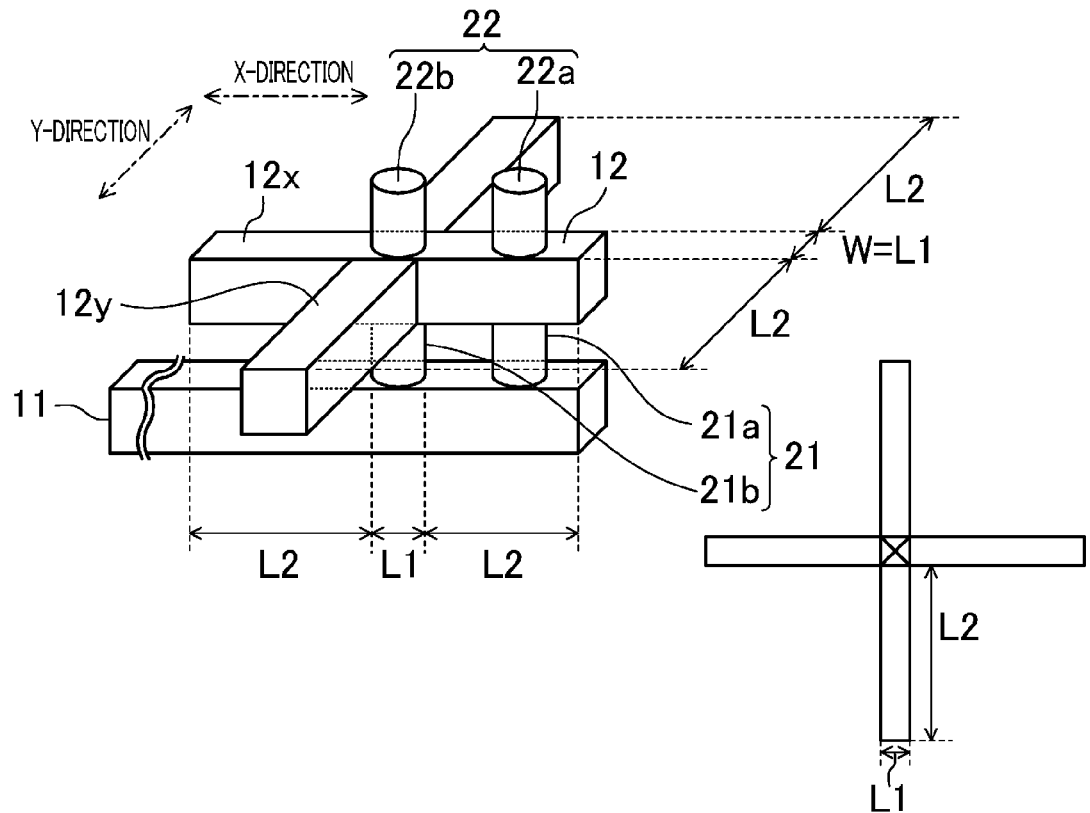
FIG. 5A is a perspective view (view on the left side) illustrating a stacked via structure in a semiconductor device of a first variation of the first embodiment, and a plan view (view on the right side) of an interconnect 12.
Figure 5B:
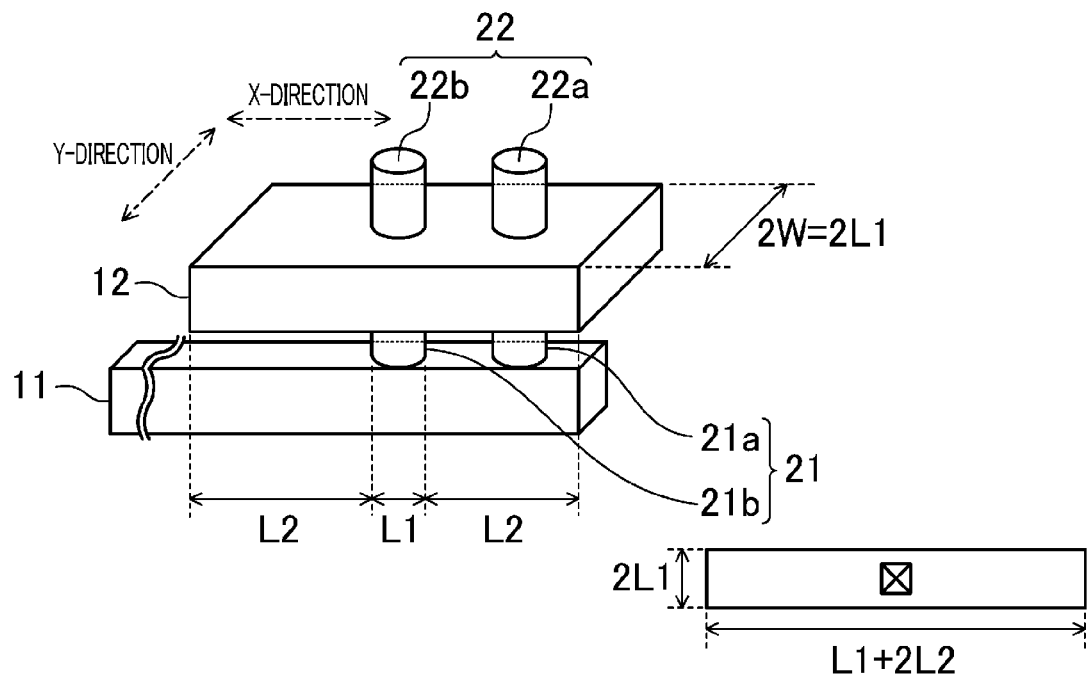
FIG. 5B is a perspective view (view on the left side) illustrating the stacked via structure in the semiconductor device of the second reference example, and a plan view (view on the right side) of an interconnect 12.

FIG. 5A is a perspective view (view on the left side) illustrating a stacked via structure in a semiconductor device of a first variation of the first embodiment, and a plan view (view on the right side) of an interconnect 12. FIG. 5B is a perspective view (view on the left side) illustrating the stacked via structure in the semiconductor device of the second reference example, and a plan view (view on the right side) of the interconnect 12.

In the semiconductor device of the present variation, the interconnect 12 formed in a second interconnect layer extends in a X-direction and a Y-direction (interconnect width direction) perpendicular to the X-direction with reference to a via 21b of a plurality of vias 21 positioned on a downstream side of interconnects 11, 12 in a current flow direction thereof. Note that FIG. 5A illustrates the example where the X-direction and an extension direction of an extension part 12y are perpendicular to each other.

Since the interconnect 12 has an extension part 12x extending in an extension direction thereof and the extension part 12y extending in a direction perpendicular to the extension direction of the extension part 12x, a greater heat dissipating effect can be obtained, thereby improving EM resistance.

As in the extension part 12x, the length of the extension part 12y is preferably more than six times as long as a via width so that the heat dissipating effect can be effectively improved. More preferably, if the length of the extension part 12y is more than eight times as long as the via width, the heat dissipating effect can be further improved. In such a case, the via width means the length of part of the via 21 contacting the interconnect 12 in the extension direction of the extension part 12y.

As the semiconductor device of the second reference example, the example will be described, in which the interconnect 12 is, referring to FIG. 5B, extended in a X-direction (interconnect length direction, i.e., an extension direction of the interconnect 12 in a via formation region) and a Y-direction with the same volume of the interconnect 12 as that of the interconnect 12 of the semiconductor device illustrated in FIG. 5A.

In the case of the stacked via structure in which the interconnect width is merely increased, the area of a heat dissipation surface (i.e., the surface area of the extension parts 12x, 12y) is smaller than the surface area of the extension parts of the interconnect of the present variation illustrated in FIG. 5A.

Specifically, the perimeter (equivalent to the surface area) of the extension parts 12x, 12y in the semiconductor device (see FIG. 5A) of the present variation is represented by 3L1+6L2, and the perimeter of the extension part of the interconnect 12 in the semiconductor device (see FIG. 5B) of the second reference example is represented by 3L1+2L2.

Under the condition of L2=6L1 required for a sufficient heat dissipating effect, the interconnect perimeter in the present variation illustrated in FIG. 5A is 2.6 times as long as that in the second reference example illustrated in FIG. 5B. Even if the interconnect 12 is, as in the second reference example, extended in a plate shape toward outside relative to the via 21b, the length L2 from the via 21 to one end of the interconnect 12 is set to be more than six times as long as the via width L1, thereby improving the heat dissipating effect. However, the semiconductor device of the present variation is configured to have a greater heat dissipating effect.

In the example illustrated in FIG. 5A, the extension part 12y protrudes on both sides relative to the via 21b, but may be protrude only on one side depending on requirements of an interconnect layout. In addition, if there is not a sufficient free space in the X-direction illustrated in FIG. 5A, only the extension part 12y may be provided without providing the extension part 12x.

If the length of the extension part 12x is more than six times as long as the via width of the via 21b, a high heat dissipating effect is already ensured. Thus, even if the length of the extension part 12y is less than six times as long as the via width, a certain level of the heat dissipating effect can be ensured.

In FIG. 5A, a plurality of vias 22 are a via 22a and a via 22b. However, only the via 21a may be provided.

The extension part 12y extends straight, but the present disclosure is not limited to such a shape. The extension part 12y may be in, e.g., a shape having a bent part or a curved part. In such a case, the length L2 of the extension part 12y in the extension direction thereof is preferably more than six times as long as the via width L1.

Semiconductor Device of Second Variation

Figure 6:
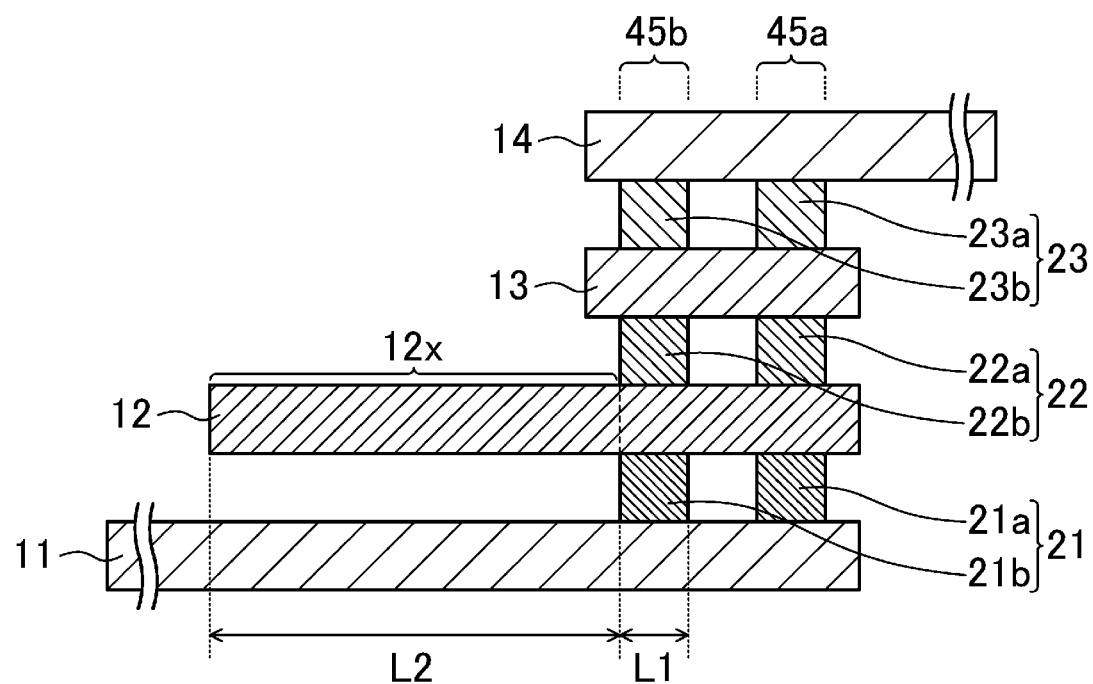
FIG. 6 is a cross-sectional view illustrating a semiconductor device of a second variation of the first embodiment.

FIG. 6 is a cross-sectional view illustrating a semiconductor device of a second variation of the first embodiment.

Referring to FIG. 6, the semiconductor device of the present variation has a stacked via structure of four interconnect layers. That is, the semiconductor device of the present variation includes the following: a plurality of interlayer insulating films formed on a substrate (not shown in the figure) made of a semiconductor; an interconnect 11 formed in a first interconnect layer; an interconnect 12 formed in a second interconnect layer; an interconnect 13 formed in a third interconnect layer; an interconnect 14 formed in a fourth interconnect layer; a plurality of vias 21 connecting the interconnects 11, 12; a plurality of vias 22 connecting the interconnects 12, 13; and a plurality of vias 23 connecting the interconnects 13, 14. The interlayer insulating film is interposed between the interconnects 11, 12, between the interconnects 12, 13, and between the interconnects 13, 14. The interconnect 11 is the lowermost interconnect, and the interconnect 14 is the uppermost interconnect. In addition, the interconnects 12, 13 are intermediate interconnects.

The vias 21 are a via 21a and a via 21b arranged in parallel. The vias 22 are a via 22a and a via 22b arranged in parallel. The vias 23 are a via 23a and a via 23b arranged in parallel. The vias 21a, 22a, 23a form a stacked via 45a, and the vias 21b, 22b, 23b form a stacked via 45b. The vias 21 are arranged with a relatively-narrow pitch, the vias 22 are arranged with a relatively-narrow pitch, and the vias 23 are arranged with a relatively-narrow pitch. In the stacked via structure, resistance in a current flow path is lower than that in typical multiple interconnect layers, and a voltage drop (IR drop) is suppressed at the minimum level. Thus, the stacked via structure is preferably used for a section configured to supply high current, such as a power supply.

In the semiconductor device illustrated in FIG. 6, current flows from the interconnect 14 in the uppermost interconnect layer to the interconnect 11 in the lowermost interconnect layer during an operation.

In the semiconductor device of the present variation, the interconnect 12 has an extension part 12x extending from a formation position of the via 21b of the vias 21 closest to one end part of the interconnect 12 toward the one end part of the interconnect 12 by a length L2 which is more than six times as long as a via width L1 of the via 21b. The via 21b is a via positioned on a downstream side of the interconnects 11, 12 in a current flow direction thereof.

Note that the position of an end of the stacked via 45b is substantially coincident with the position of an end of the via 21b in the semiconductor device of the present variation. Since the via connected to the interconnects 11, 12 is not connected to the extension part 12x, a current flow path is not formed during the operation.

According to the foregoing configuration, since no Joule heat is generated in the extension part 12x, the extension part 12x can function as a heat dissipator. That is, the extension part 12x is formed in the interconnect 12 having high heat conductivity, thereby obtaining, for the interconnect 12, an additional surface area (perimeter) equivalent to the length L2. Heat is dissipated at a contact part between the interconnect and the interlayer insulating film interposed between adjacent ones of the interconnects. Thus, Joule heat generated in the via 21b in which current is concentrated can be effectively dissipated through the extension part 12x, thereby significantly improving EM resistance.

A heat dissipating effect of the extension part 12x is ensured even if the length L2 of the extension part 12x is less than six times as long as the via width L1 (and more than one fold of the via width L1). However, since heat generated in the via 21b in which current concentration is likely to occur can be effectively dissipated, the length L2 is preferably more than six times as long as the via width L1. Since a greater heat dissipating effect can be ensured, the length L2 of the extension part 12x is more preferably more than eight times as long as the via width L1, and still more preferably more than ten times as long as the via width L1.

Current flowing through the via 21b in the case of the stacked via structure having many interconnect layers is higher than current flowing through the via 21b in the case illustrated in FIGS. 1A-1C by current flowing through the interconnect 12. Thus, in the case of the stacked via structure having many interconnect layers, the configuration of the present variation in which Joule heat generated in the via 21b can be more effectively dissipated is extremely effective.

Since the heat dissipating effect can be further improved, an extension part 12y extending from the formation position of the via 21b in an interconnect width direction of the interconnect 12 is, as in the semiconductor device of the first variation, preferably formed in the semiconductor device of the present variation.

Since the heat dissipating effect can be still further improved, an extension part extending from a formation position of the via 22b (i.e., the end of the stacked via 45b) and positioned above the extension 12x is preferably formed not only in the interconnect 12 but also in the interconnect 13 which is an intermediate interconnect.

FIG. 6 illustrates the stacked via structure having four interconnect layers. However, the heat dissipating effect similar to that of the semiconductor device of the present variation can be expected even in a stacked via structure having five or more interconnect layers, such as a stacked via structure having five or six interconnect layers. In such a case, an extension part may be formed in at least one of intermediate interconnects, or extension parts may be formed respectively in all of intermediate interconnects.

The widths of the interconnects 12, 13 which are the intermediate interconnects are substantially identical to each other. The width of the interconnect means the width of the interconnect in a direction perpendicular to an extension part length direction as viewed from above the substrate.

Second Embodiment

Figure 7:
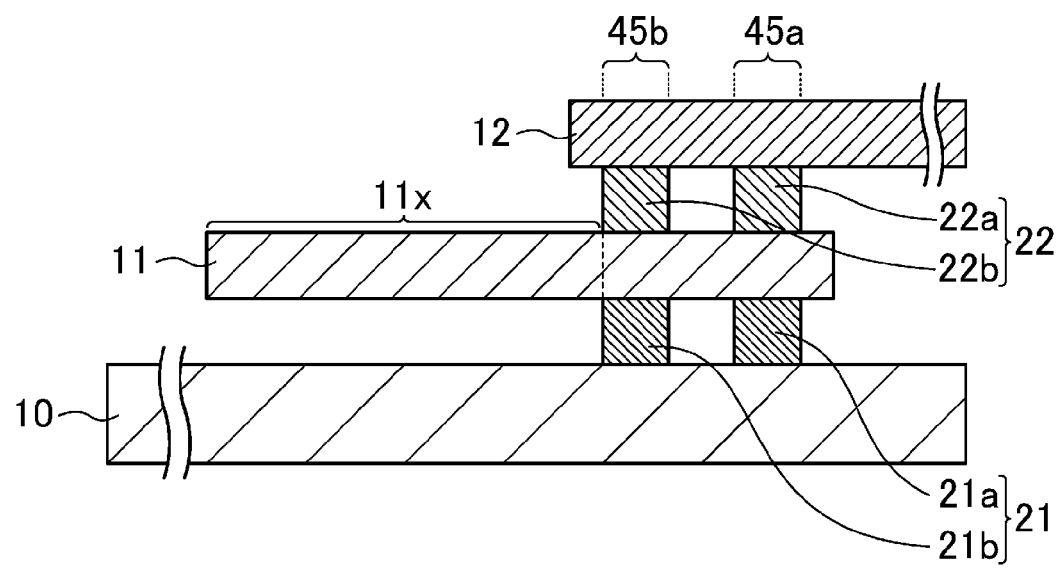
FIG. 7 is a cross-sectional view illustrating a semiconductor device of a second embodiment of the present disclosure.

FIG. 7 is a cross-sectional view illustrating a semiconductor device of a second embodiment of the present disclosure.

The semiconductor device of the present embodiment is different from the semiconductor device of the first embodiment illustrated in FIG. 3A in that a stacked via structure has two interconnect layers and an extension part 11x is formed in an interconnect 11 connected to a substrate 10 through a plurality of vias 21.

That is, the semiconductor device of the present embodiment includes the following: interconnects 11, 12 stacked in this order from the bottom on the substrate 10 made of a semiconductor and formed respectively in first and second interconnect layers; the plurality of vias 21 connecting the substrate 10 and the interconnect 11; and a plurality of vias 22 connecting the interconnects 11, 12. The vias 21 are connected to, e.g., an impurity diffusion layer of the substrate 10.

The vias 21 are a via 21a and a via 21b arranged in parallel, and the vias 22 are a via 22a and a via 22b arranged in parallel. The vias 21a, 22a form a stacked via 45a, and the vias 21b, 22b form a stacked via 45b. The vias 21 are arranged with a relatively-narrow pitch, and the vias 22 are arranged with a relatively-narrow pitch. In the stacked via structure, resistance in a current flow path is lower than that in typical multiple interconnect layers, and a voltage drop (IR drop) is suppressed at the minimum level. Thus, the stacked via structure is preferably used for a section configured to supply high current, such as a power supply.

In the case of the semiconductor device illustrated in FIG. 7, current flows from the interconnect 12 to the substrate 10 during an operation.

In the semiconductor device of the present embodiment, the interconnect 11 has the extension part 11x extending from a formation position of the via 21b of the vias 21 closest to one end part of the interconnect 11 toward the one end part of the interconnect 11. The via 21b is a via positioned on a downstream side of the substrate 10 and the interconnect 11 in a current flow direction thereof. Note that the position of an end of the stacked via 45b is substantially coincident with the position of an end of the via 21b in the semiconductor device of the present embodiment. Since the via connected to the substrate 10 or the interconnect 12 is not connected to the extension part 11x, a current flow path is not formed during the operation.

According to the foregoing configuration, since no Joule heat is generated in the extension part 11x, the extension part 11x can function as a heat dissipator. That is, the extension part 11x is formed in the interconnect 11 having high heat conductivity, thereby obtaining, for the interconnect 11, an additional surface area (perimeter) equivalent to a length L2. Heat is dissipated at a contact part between the interconnect and an interlayer insulating film. Thus, Joule heat generated in the via 21b in which current is concentrated can be effectively dissipated through the extension part 11x, thereby significantly improving EM resistance.

A heat dissipating effect can be obtained if the length L2 of the extension part 11x is at least greater than a via width L1 of the via 21b. However, since heat generated in the via 21b can be effectively dissipated, the length L2 of the extension part 11x is preferably more than six times as long as the via width L1.

Since the heat dissipating effect of the extension part 11x can be further improved, the length L2 of the extension part 11x is more preferably more than eight times as long as the via width L1 of the via 21b. For still further improvement of the heat dissipating effect of the extension part 11x, the length L2 of the extension part 11x is still more preferably more than ten times as long as the via width L1.

In the case where the via 21b is connected to the substrate 10, the EM resistance is somewhat increased as compared to the case where the via 21b is connected to the lowermost interconnect. Thus, higher current can be applied to the semiconductor device of the present embodiment as compared to that applied to the semiconductor device of the first embodiment.

Since the heat dissipating effect can be still further improved, an extension part extending from the via 22b toward outside is preferably formed not only in the interconnect 11 but also in the interconnect 12.

The stacked via structure including the substrate 10 and the two interconnect layers has been described with reference to FIG. 7. The heat dissipating effect similar to that of the present embodiment can be obtained even in a stacked via structure including three or more interconnect layers and a substrate 10. With reduction in EM occurrence, high current can flow from an interconnect formed in the uppermost interconnect to the substrate.

Specific Example of Second Embodiment

Figure 8A:
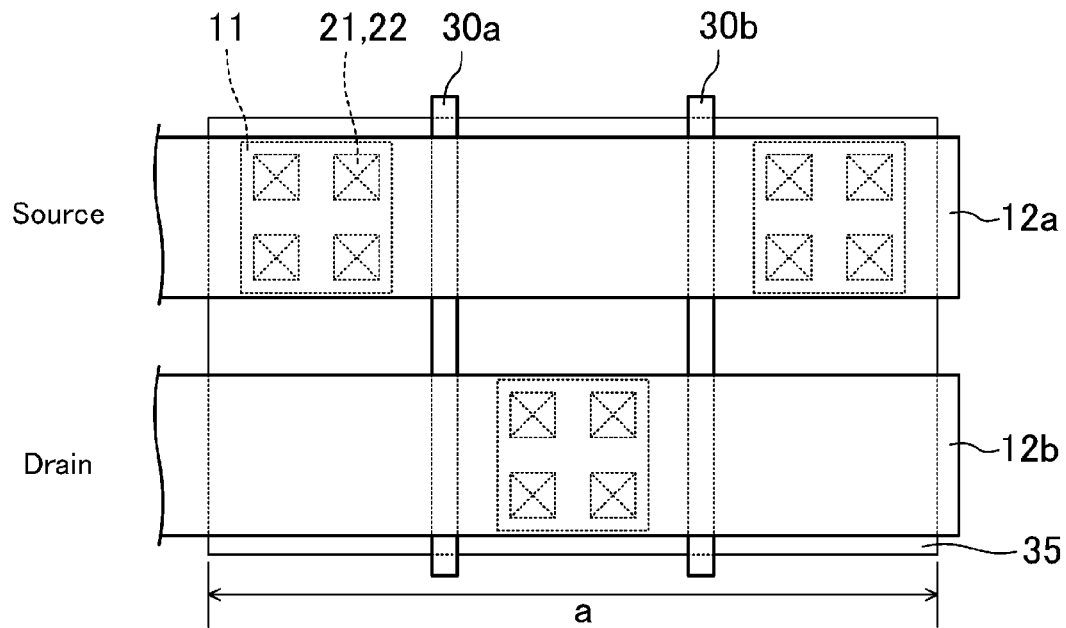
FIG. 8A is a view illustrating a cell layout of a semiconductor device of a fourth reference example where a stacked via structure is used for parallel transistors forming, e.g., an analog driver circuit.
Figure 8B:
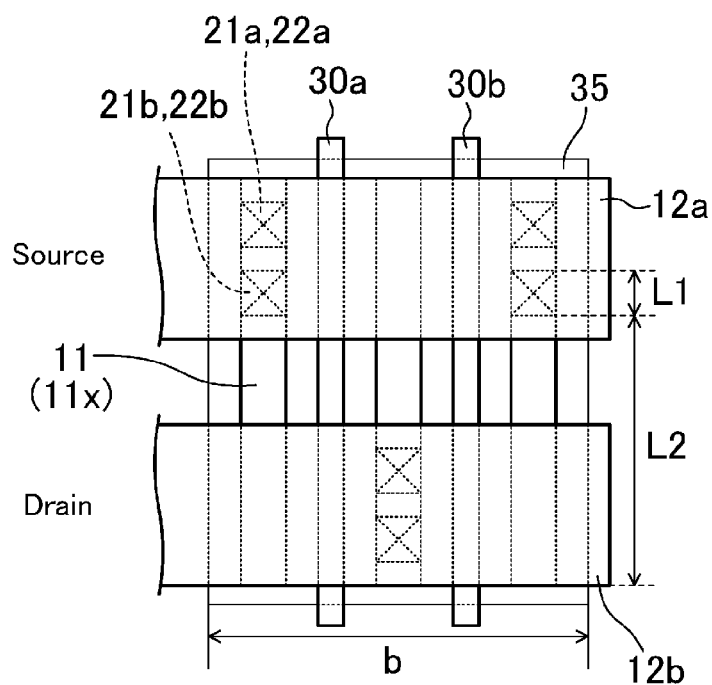
FIG. 8B is a view illustrating a layout of a specific example where a stacked via structure of the second embodiment is employed.

FIG. 8A is a view illustrating a cell layout of a semiconductor device of a fourth reference example where a stacked via structure is used for parallel transistors forming, e.g., an analog driver circuit, and FIG. 8B is a view illustrating a layout of a specific example where the stacked via structure of the second embodiment is employed for parallel transistors forming, e.g., an analog driver circuit.

In each of the examples illustrated in FIGS. 8A and 8B, gate electrodes 30a, 30b are provided on a substrate, and an impurity diffusion layer 35 to be formed into source/drain regions is formed in a region of the substrate on both sides relative to the gate electrodes 30a, 30b. Interconnects 12a, 12b extending in a direction perpendicular to an extension direction of the gate electrodes 30a, 30b are formed above the substrate. The source region of the transistor and the interconnect 12a are electrically connected together through a plurality of source-side vias 21, 22 and an interconnect 11. The drain region of the transistor and the interconnect 12b are electrically connected together through a plurality of drain-side vias 21, 22.

In the case where current flowing through the transistor exceeds allowable current of the interconnect or the via, it is required for the fourth reference example illustrated in FIG. 8A that the vias 21, 22 forming stacked vias are, as viewed in the plane, arranged in two rows in the extension direction of the gate electrodes 30a, 30b to increase the width of the interconnect 11 (the width of the interconnect 11 in the direction perpendicular to the gate electrodes 30a, 30b). This increases the allowable current in the interconnect 11 or each of the vias 21, 22. In this case, a length a illustrated in FIG. 8A is required for the cell width.

In the semiconductor device of the specific example, each of the three interconnects 11 has an extension part 11x extending from a formation position of the via 21b in a direction parallel to the gate electrodes 30a, 30b. Since Joule heat generated in the via 21b is effectively dissipated through the extension part 11x, EM occurrence in the vias 21 can be reduced in the semiconductor device of the specific example. Thus, high current can flow through the vias 21, 22. As a result, the vias 21, 22 are arranged in a single row as viewed in the plane, thereby decreasing the width of the interconnect 11.

Thus, e.g., the arrangement of the interconnects 11 in which the extension direction of the extension part 11x of the interconnect 11 is alternately switched allows the cell width to be a length b (b<a) illustrated in FIG. 8B. According to the semiconductor device of the specific example, a smaller cell area can be realized when the same current amount as that of the layout of the third reference example is applied.

Third Embodiment

Figure 9A:
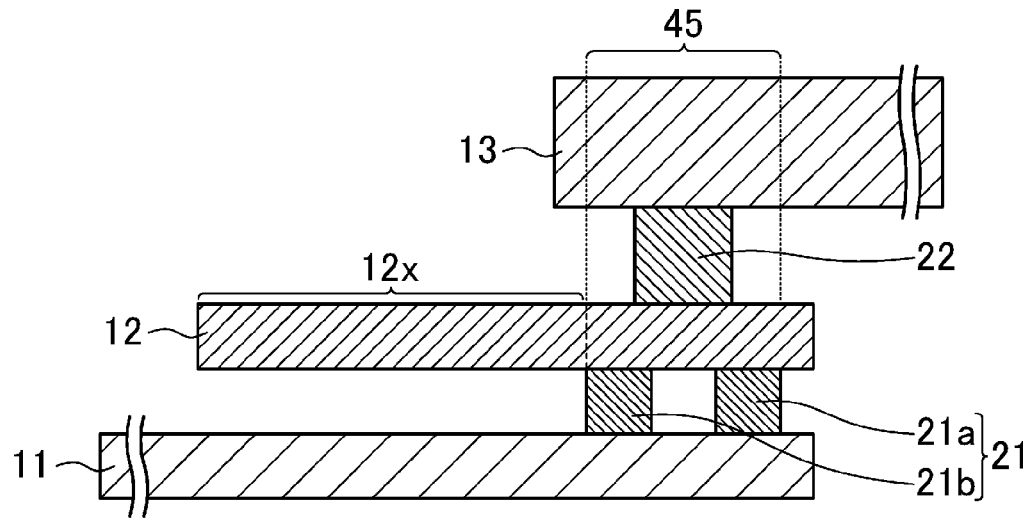
FIG. 9A is a cross-sectional view illustrating a semiconductor device of a third embodiment of the present disclosure.

FIG. 9A is a cross-sectional view illustrating a semiconductor device of a third embodiment of the present disclosure.

The semiconductor device of the present embodiment includes the following: interconnects 11, 12, 13 stacked in this order from the bottom on a substrate (not shown in the figure) made of a semiconductor and formed respectively in first, second, and third interconnect layers; a plurality of vias 21 connecting the interconnects 11, 12; and a via 22 connecting the interconnects 12, 13. The interconnect 12 has an extension part 12x extending from the position of an end of the via 21b on a downstream side of the interconnect 11 in a current flow direction thereof. Each of the vias 21a, 21b partially overlaps with the via 22 as viewed in the plane, and the vias 21a, 21b, 22 form a stacked via 45.

In the semiconductor device of the present embodiment, the number of the vias 22 connected to the interconnect 13 formed in the uppermost interconnect layer is less than the number of the vias 21 connected to the interconnect 11 formed in the lowermost interconnect layer. The width and height (thickness) of the interconnect 13 are, e.g., twice as large as those of each of the interconnects 11, 12. In such a case, the cross-sectional area of the interconnect 13 is, e.g., four times as large as that of each of the interconnects 11, 12. The vias 21 arranged in parallel between the interconnects 11, 12 are arranged with a relatively-narrow pitch. In addition, the width of the via 22 is about twice as large as that of each of the vias 21.

In the stacked via structure, resistance in a current flow path is lower than that in typical multiple interconnect layers, and a voltage drop (IR drop) is suppressed at the minimum level. Thus, the stacked via structure is preferably used for a section configured to supply high current, such as a power supply.

Particularly in the semiconductor device of the present embodiment, the cross-sectional area of the interconnect(s) formed in the upper interconnect layer(s) is greater than that of the interconnect(s) formed below such an interconnect(s), and the width of the via(s) connected to the interconnect(s) formed in the upper interconnect layer(s) is also increased. Thus, higher current can be applied to the semiconductor device of the present embodiment as compared to that applied to the semiconductor devices of the first and second embodiments and the variations thereof.

In the semiconductor device of the present embodiment, current flows from the interconnect 13 toward the interconnect 11. The extension part 12x having a length L2 extends from the position of the via 21b on the downstream side of the interconnects 11, 12 in the current flow direction thereof toward one end part of the interconnect 12. The extension part 12x is formed in the interconnect 12 having high heat conductivity, thereby obtaining, for the interconnect 12, an additional surface area (perimeter) equivalent to the length L2. Since heat is dissipated at a contact part between the interconnect and an interlayer insulating film interposed between adjacent ones of the interconnects, Joule heat generated in the via 21b in which current is concentrated can be effectively dissipated through the extension part 12x. Thus, EM resistance can be significantly improved.

A heat dissipating effect can be obtained if the length L2 of the extension part 12x is greater than a via width L1 of the via 21b. However, since heat generated in the via 21b in which the current concentration is likely to occur can be effectively dissipated, the length L2 of the extension part 12x is preferably more than six times as long as the via width L1, more preferably more than eight times as long as the via width L1, and still more preferably more than ten times as long as the via width L1.

The stacked via structure is preferably employed for, e.g., a power supply section configured to supply current to a standard cell, a power supply section of an I/O (input/output) cell, or a driver section of an analog circuit.

The interconnect 12 may have an extension part extending, in an interconnect length direction (X-direction), from the position of the via 21b on the downstream side in the current flow direction, and an extension part extending in a Y-direction crossing the X-direction.

It is preferable that the extension part 12x is not connected to the via(s) connected to the interconnects 11, 12.

The interconnect having the extension part is not limited to the interconnect 12, and it is preferable that extension parts are formed respectively in a plurality of interconnects.

The present embodiment describes the stacked via structure having three interconnect layers, but the stacked via structure may have more interconnect layers such as four or five interconnect layers.

The width of the interconnect 11 and the width of the interconnect 12 formed above the interconnect 11 may be substantially equal to each other.

FIG. 9A illustrates the example where only the single via 22 is formed, but two or more vias 22 may be formed.

Figure 9B:
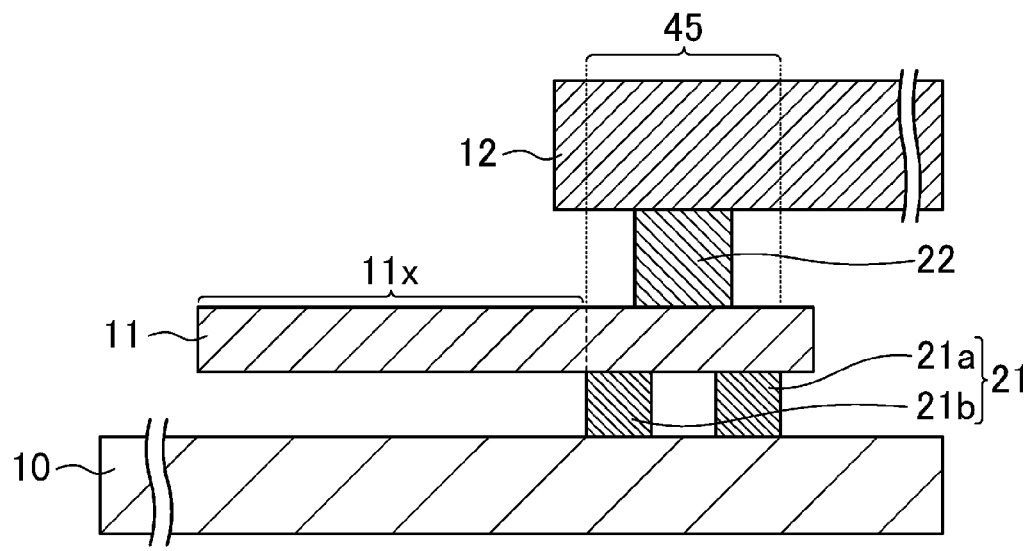
FIG. 9B is a cross-sectional view illustrating a semiconductor device of a variation of the third embodiment.

FIG. 9B is a cross-sectional view illustrating a semiconductor device of a variation of the present embodiment in which two interconnect layers and a substrate 10 form a stacked via structure. In the case of using the two interconnect layers, the cross-sectional area of an interconnect 12 formed in the uppermost interconnect layer is increased to about twice as large as that of an interconnect 11, and the width of a via 22 is increased to, e.g., about twice as large as the width of a via 21. In addition, an extension part 11x extending from a formation position of the via 21b toward outside relative to the via 21b is formed in the interconnect 11.

Even in the foregoing stacked via structure, the advantages similar to those of the semiconductor device of the specific example can be realized.

Fourth Embodiment

Figure 10A:
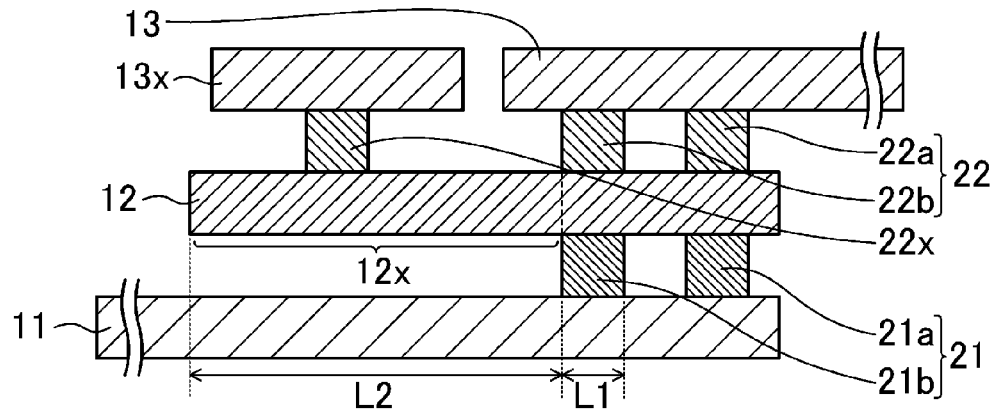
FIG. 10A is a cross-sectional view illustrating a semiconductor device of a fourth embodiment of the present disclosure.

FIG. 10A is a cross-sectional view illustrating a semiconductor device of a fourth embodiment of the present disclosure. Referring to FIG. 10A, the semiconductor device of the present embodiment includes the following: interconnects 11, 12, 13 stacked in this order from the bottom on a substrate (not shown in the figure) made of a semiconductor and formed respectively in first, second, and third interconnect layers; a plurality of vias 21 connecting the interconnects 11, 12; and a plurality of vias 22 connecting the interconnects 12, 13. The interconnect 12 has an extension part 12x extending from the position of an end of a via 21b closest to one end part of the interconnect 12 (i.e., the position of the end of the via 21b on a downstream side of the interconnect 12 in a current flow direction thereof). The vias 21 are a via 21a and the via 21b arranged in parallel, and the vias 22 are a via 22a and a via 22b arranged in parallel. The vias 21 are arranged with a relatively-narrow pitch, and the vias 22 are arranged with a relatively-narrow pitch. In the stacked via structure, resistance in a current flow path is lower than that in typical multiple interconnect layers, and a voltage drop (IR drop) is suppressed at the minimum level. Thus, the stacked via structure is preferably used for a section configured to supply high current, such as a power supply.

The semiconductor device of the present embodiment is different from that of the first embodiment illustrated in FIG. 3A in that the stacked via structure further includes a dummy via 22x formed on the extension part 12x of the interconnect 12 and a dummy interconnect 13x positioned on the dummy via 22x and formed in the interconnect layer identical to that of the interconnect 13 so as to be electrically separated from the interconnect 13.

In the example illustrated in FIG. 10A, current flows from the interconnect 13 toward the interconnect 11. Current does not substantially flow through the extension part 12x, the dummy via 22x, and the dummy interconnect 13x.

Since the semiconductor device of the present embodiment is configured such that the interconnect 12 has the extension part 12x having a length L2 which is at least greater than a via width L1 of the via 21b, the extension part 12x can function as a heat dissipator. In addition, since the dummy interconnect 13x electrically separated from the interconnect 13 and the dummy via 22x connecting the extension part 12x and the dummy interconnect 13x together are formed, the dummy via 22x and the dummy interconnect 13x can also function as heat dissipators. Thus, according to the semiconductor device of the present embodiment, a heat dissipating effect can be more improved as compared to that in the semiconductor device of the first embodiment.

In order to sufficiently increase the heat dissipating effect of the extension part 12x, the length L2 of the extension part 12x is, as in the other embodiments, preferably more than six times as long as the via width L1 of the via 21b, more preferably more than eight times as long as the via width L1 of the via 21b, and still more preferably more than ten times as long as the via width L1 of the via 21b.

A single dummy via 22x may be formed, but two or more dummy vias 22x are preferably formed. It is preferable that the dummy interconnect 13x is formed with the longest possible length.

The interconnect 12 may have an extension part extending from the via 21b positioned on the downstream side in the current flow direction in an interconnect length direction (X-direction), and an extension part extending in a Y-direction crossing the X-direction.

The interconnect having the extension part is not limited to the interconnect 12, and it is preferable that extension parts are formed respectively in a plurality of interconnects.

The present embodiment describes the stacked via structure having three interconnect layers, but the stacked via structure may have more interconnect layers such as four or five interconnect layers.

The width of the interconnect 11 and the width of the interconnect 12 formed above the interconnect 11 may be substantially equal to each other, and the width of the interconnect 12 and the width of the interconnect 13 may be substantially equal to each other.

Figure 10B:
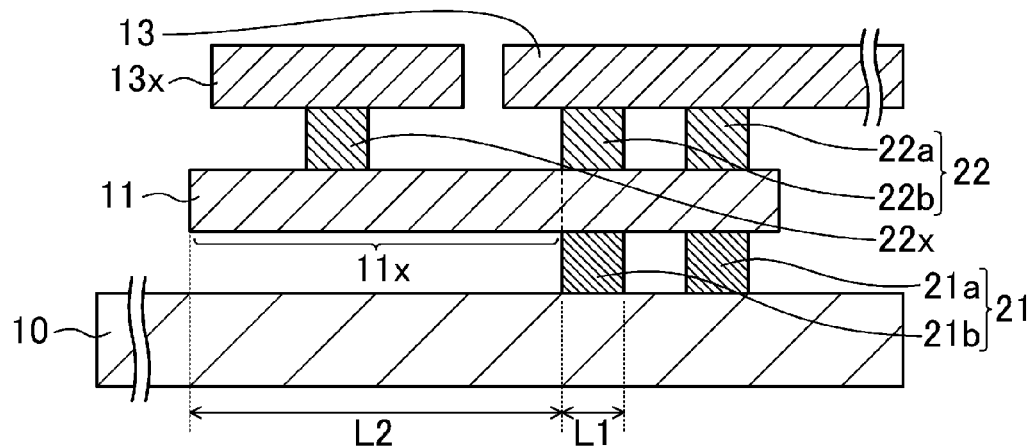
FIG. 10B is a cross-sectional view illustrating a semiconductor device of a first variation of the fourth embodiment.

FIG. 10B is a cross-sectional view illustrating a semiconductor device of a first variation of the present embodiment. Although FIG. 10A illustrates the stacked via structure having three interconnect layers, a stacked via structure may include, referring to FIG. 10B, a substrate 10 and two interconnect layers. In the present variation, an interconnect 11 has an extension part 11x which is to be a heat dissipator. In addition, a dummy via 22x is formed on the extension part 11x, and a dummy interconnect 13x is formed on the dummy via 22x in the interconnect layer identical to that of the interconnect 13.

Even in the foregoing configuration, the extension part 11x, the dummy via 22x, and the dummy interconnect 13x can function as heat dissipators, thereby improving EM resistance. Thus, application of high current is allowed.

The number of interconnect layers may be further increased in the foregoing configuration, and the stacked via structure may include three or more interconnect layers and a substrate.

Figure 10C:
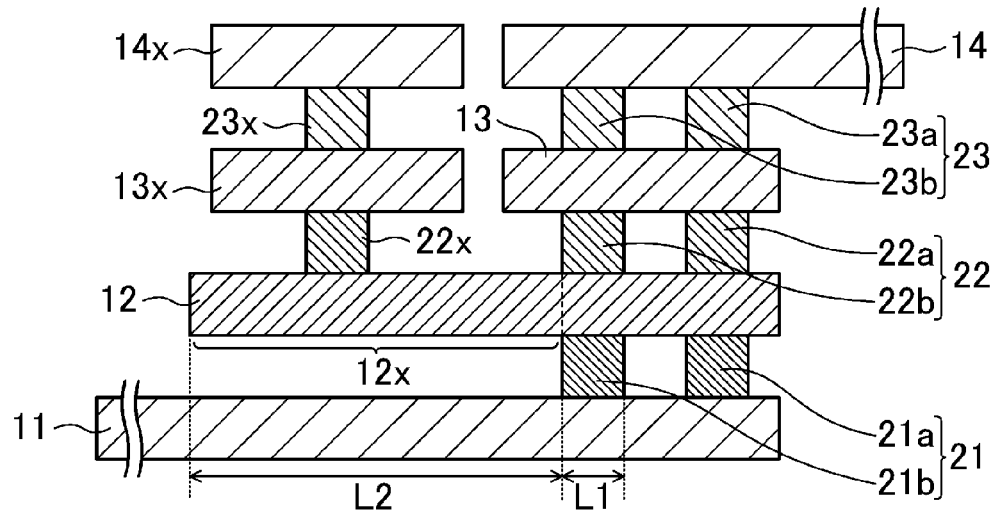
FIG. 10C is a cross-sectional view illustrating a semiconductor device of a second variation of the fourth embodiment.

FIG. 10C is a cross-sectional view illustrating a semiconductor device of a second variation of the present embodiment.

If a stacked via structure includes, in the semiconductor device of the present embodiment, four or more interconnect layers and vias connecting the interconnect layers together, more dummy interconnects and more dummy vias connecting the dummy interconnects together may be formed.

In the semiconductor device of the second variation illustrated in FIG. 10C, an interconnect 14 is provided above an interconnect 13 as the uppermost interconnect layer, and a plurality of vias 23 connecting the interconnects 13, 14 together and arranged in parallel are formed.

An interconnect 12 has an extension part 12x. A dummy interconnect 13x arranged in the interconnect layer identical to that of the interconnect 13 and electrically separated from the interconnect 13, and a dummy interconnect 14x arranged in the interconnect layer identical to that of the interconnect 14 and electrically separated from the interconnect 14 are stacked above the extension part 12x in this order from the bottom. The extension part 12x and the dummy interconnect 13x are connected together through a dummy via 22x, and the dummy interconnects 13x, 14x are connected together through a dummy via 23x.

According to the foregoing configuration, the dummy interconnects each formed in the interconnect layer identical to that of a corresponding one of the upper interconnects, and the dummy vias each connecting adjacent ones of the dummy interconnects can function as heat dissipators. Thus, heat generated in the via can be more effectively dissipated, thereby improving EM resistance. Even if a lower interconnect(s) is miniaturized, high current can flow through the semiconductor device by using the stacked via structure. In particular, an upper interconnect layer has a more space than an interconnect layer(s) below the upper interconnect layer, and therefore a heat dissipating effect can be easily increased by the long dummy interconnect 14x. As in the stacked via structure in which the vias are connected to the substrate, one or more dummy interconnects may be, referring to FIG. 10B, formed above the dummy interconnect 13x.

Figure 11A:
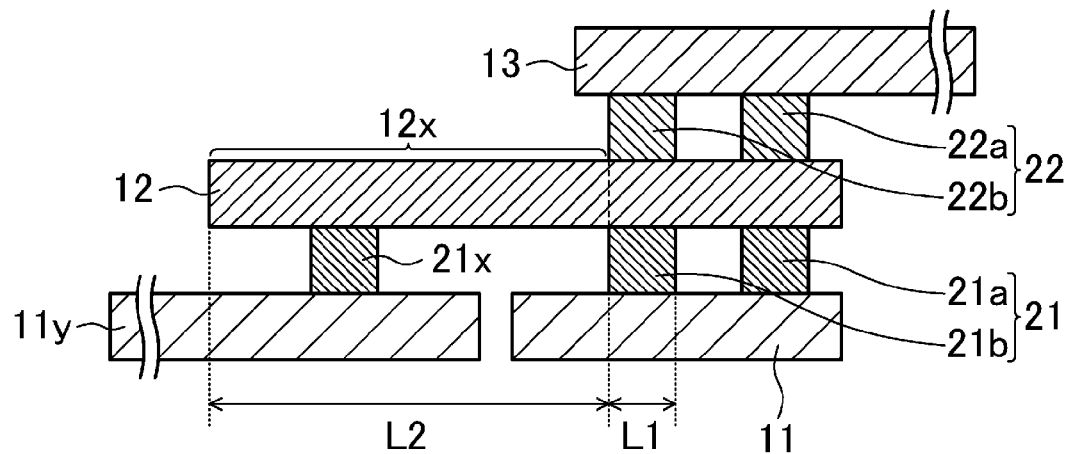
FIG. 11A is a cross-sectional view illustrating a semiconductor device of a third variation of the fourth embodiment.

FIG. 11A is a cross-sectional view illustrating a semiconductor device of a third variation of the present embodiment. Referring to FIG. 11A, a dummy via and a dummy interconnect may be formed below an extension part 12x of an interconnect 12 instead of forming the dummy via and the dummy interconnect on the extension part 12x of the interconnect 12.

That is, in the semiconductor device of the present variation, a dummy interconnect 11y arranged in an interconnect layer identical to that of an interconnect 11 and electrically separated from the interconnect 11 and a dummy via 21x are formed below the extension part 12x of the interconnect 12, in addition to the configuration of the semiconductor device of the first embodiment illustrated in FIG. 3A-3C. Current does not substantially flow through the dummy interconnect 11y and the dummy via 21x during an operation.

In the foregoing configuration, the dummy via 21x and the dummy interconnect 11y can function as heat dissipators as in the extension part 12x. Thus, Joule heat generated in a via 21b in which current is concentrated can be effectively dissipated through the extension part 12x, the dummy via 21x, and the dummy interconnect 11y, thereby significantly improving EM resistance.

Figure 11B:
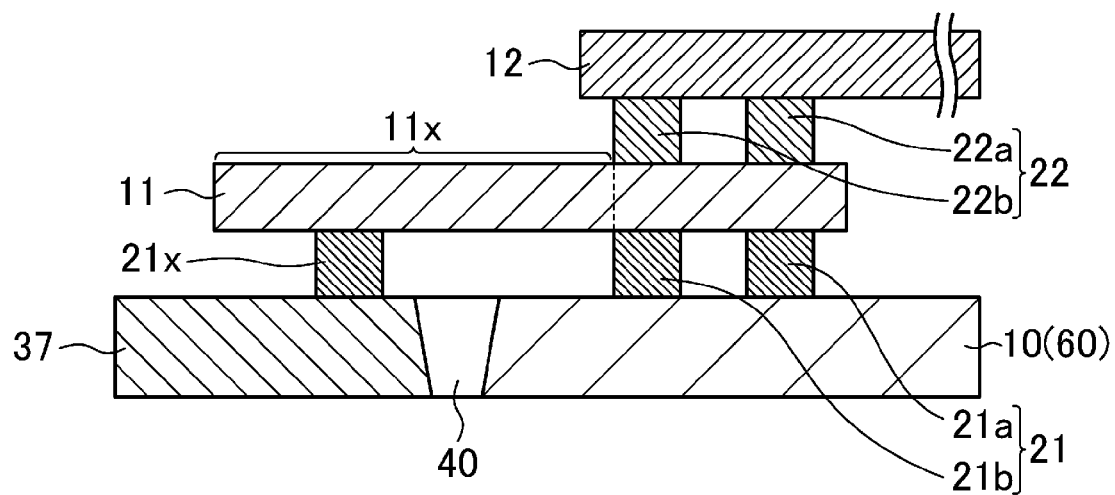
FIG. 11B is a cross-sectional view illustrating a semiconductor device of a fourth variation of the fourth embodiment.

FIG. 11B is a cross-sectional view illustrating a semiconductor device of a fourth variation of the present embodiment. Referring to FIG. 11B, in a stacked via structure including a plurality of vias 21, a plurality of vias 22, interconnects 11, 12, and a substrate 10, a dummy via 21x connecting an extension part 11x and a dummy diffusion layer 37 formed in the substrate 10 together may be formed.

In the foregoing case, a via 21a and a via 21b are connected to, e.g., an impurity diffusion layer 60 formed in the substrate 10. The dummy diffusion layer 37 connected to the dummy via 21x is electrically separated from the impurity diffusion layer 60 by, e.g., an element isolation region 40, and is in an electrically-floating state.

In this example, since Joule heat generated in the via 21b is transmitted to the dummy via 21x and the dummy diffusion layer 37 through the extension part 11x of the interconnect 11, the extension part 11x, the dummy via 21x, and the dummy diffusion layer 37 can function as heat dissipators. Thus, Joule heat generated in the via of the stacked via structure can be effectively dissipated, thereby improving EM resistance.

In the semiconductor devices of the foregoing embodiments, variations, reference examples, and specific example, the shapes, structures, materials, etc. of the interconnect and the via can be changed as necessary without departing from the spirit or scope of the present disclosure.

The stacked via structure of each of the above-described embodiments and examples of the present disclosure is useful for various circuits such as a cell power supply used for a semiconductor integrated circuit having multiple interconnect layers and an analog driver circuit.

What is claimed is:

1. A semiconductor device comprising:
   a stacked via structure including:
      a plurality of first vias formed over a substrate,
      a first interconnect formed on the plurality of first vias,
      a plurality of second vias formed on the first interconnect, and
      a second interconnect formed on the plurality of second vias,
   wherein one of the plurality of first vias closest to one end part of the first interconnect and one of the plurality of second vias closest to the one end part of the first interconnect at least partially overlap with each other as viewed in plane, and
   the first interconnect has a first extension part extending from a position of an end of the one of the plurality of first vias closest to the one end part of the first interconnect toward the one end part of the first interconnect,
   wherein the first interconnect has a second extension part extending from the position of the end of the one of the plurality of first vias closest to the one end part of the first interconnect in a direction crossing an extension direction of the first extension part.

2. The semiconductor device of claim 1, further comprising:
   a third interconnect formed above the substrate and below the first interconnect.

3. The semiconductor device of claim 1, wherein the substrate is connected to the first interconnect through the plurality of first vias.

4. The semiconductor device of claim 1, wherein a length of the second extension part is more than six times as long as a via width of the one of the plurality of first vias.

5. The semiconductor device of claim 1, further comprising:
one or more upper interconnects formed above the second interconnect; and
an upper via electrically connecting the second interconnect and the upper interconnects together and at least partially overlapping with the plurality of first vias and the plurality of second vias as viewed in the plane.

6. The semiconductor device of claim 5, wherein of the second interconnect and the upper interconnects, at least one of intermediate interconnects other than an uppermost interconnect has a third extension part extending from a position of an end of the second via or the upper via toward an end part of each of the intermediate interconnects.

7. The semiconductor device of claim 5, wherein
the plurality of first vias are connected to a lowermost interconnect, and
the upper via connected to the uppermost interconnect of the upper interconnects has a via width which is more than twice as large as the via width of the one of the plurality of first vias.

8. The semiconductor device of claim 5, wherein
the plurality of first vias are connected to a lowermost interconnect, and
the number of the upper via connected to an uppermost interconnect of the upper interconnects is less than the number of the plurality of first vias.

9. The semiconductor device of claim 1, wherein
the second interconnect is an uppermost interconnect,
the plurality of first vias are connected to a lowermost interconnect, and
a via width of each of the plurality of second vias is more than twice as large as a via width of each of the plurality of first vias.

10. The semiconductor device of claim 1, wherein a width of the first interconnect is substantially equal to a width of the second interconnect.

11. The semiconductor device of claim 1, wherein the first extension part extends from the position of the end of the one of the plurality of first vias closest to the one end part of the first interconnect toward the one end part of the first interconnect so as to have a length which is more than eight times as long as the via width of the one of the plurality of first vias.

12. The semiconductor device of claim 1, wherein the one of the plurality of first vias closest to the one end part of the first interconnect is positioned in a downstream end part of a current flow path for current flowing in the first interconnect in an extension direction thereof.

13. The semiconductor device of claim 1, wherein
the plurality of second vias connected to the second interconnect are not connected to the first extension part.

14. The semiconductor device of claim 1, wherein the first interconnect has a length which is more than six times as long as a via width of the one of the plurality of first vias.

15. A semiconductor device comprising:
a stacked via structure including:
a plurality of first vias formed over a substrate,
a first interconnect formed on the plurality of first vias,
a plurality of second vias formed on the first interconnect, and
a second interconnect formed on the plurality of second vias,
wherein one of the plurality of first vias closest to one end part of the first interconnect and one of the plurality of second vias closest to the one end part of the first interconnect at least partially overlap with each other as viewed in plane, and
the first interconnect has a first extension part extending from a position of an end of the one of the plurality of first vias closest to the one end part of the first interconnect toward the one end part of the first interconnect,
further comprising:
a first dummy via formed on the first extension part; and
a first dummy interconnect which is formed on the first dummy via in an interconnect layer identical to that of the second interconnect and in which a substantial current flow path is not formed during an operation.

16. The semiconductor device of claim 15, further comprising:
at least one upper dummy interconnect formed above the first dummy interconnect; and
an upper dummy via formed between the first dummy interconnect and the at least one upper dummy interconnect.

17. The semiconductor device of claim 15, wherein the first interconnect has a length which is more than six times as long as a via width of the one of the plurality of first vias.

18. A semiconductor device comprising:
a stacked via structure including:
a plurality of first vias formed over a substrate,
a first interconnect formed on the plurality of first vias,
a plurality of second vias formed on the first interconnect, and
a second interconnect formed on the plurality of second vias,
wherein one of the plurality of first vias closest to one end part of the first interconnect and one of the plurality of second vias closest to the one end part of the first interconnect at least partially overlap with each other as viewed in plane, and
the first interconnect has a first extension part extending from a position of an end of the one of the plurality of first vias closest to the one end part of the first interconnect toward the one end part of the first interconnect,
further comprising:
a third interconnect formed above the substrate and below the first interconnect,
a first dummy via formed below the first extension part; and
a first dummy interconnect which is formed below the first dummy via in an interconnect layer identical to that of the third interconnect and in which a substantial current flow path is not formed during an operation.

19. The semiconductor device of claim 18, wherein the first interconnect has a length which is more than six times as long as a via width of the one of the plurality of first vias.

20. A semiconductor device comprising:
a stacked via structure including:
a plurality of first vias formed over a substrate,
a first interconnect formed on the plurality of first vias,
a plurality of second vias formed on the first interconnect, and
a second interconnect formed on the plurality of second vias,
wherein one of the plurality of first vias closest to one end part of the first interconnect and one of the plurality of second vias closest to the one end part of the first interconnect at least partially overlap with each other as viewed in plane, and
the first interconnect has a first extension part extending from a position of an end of the one of the plurality of first vias closest to the one end part of the first interconnect toward the one end part of the first interconnect,
wherein the substrate is connected to the first interconnect through the plurality of first vias, and further comprising:
an impurity-containing diffusion layer formed in the substrate and connected to the plurality of first vias;
an impurity-containing dummy diffusion layer formed in the substrate and electrically separated from the diffusion layer; and
a first dummy via directly connecting the first extension part and the dummy diffusion layer together.

21. The semiconductor device of claim 20, wherein the first interconnect has a length which is more than six times as long as a via width of the one of the plurality of first vias.

22. A semiconductor device comprising:
a stacked via structure including:
a plurality of first vias formed over a substrate,
a first interconnect formed on the plurality of first vias,
a second via formed on the first interconnect, and
a second interconnect formed on the second via,
wherein the first interconnect has an extension part extending from a position of an end of one of the plurality of first vias closest to one end part of the first interconnect toward the one end part of the first interconnect and having a length which is more than six times as long as a via width of the one of the plurality of first vias, and
wherein the first interconnect has a second extension part extending from the position of the end of the one of the plurality of first vias closest to the one end part of the first interconnect in a direction crossing an extension direction of the first extension part.

* * * * *